(12) United States Patent
Huang et al.

(10) Patent No.: US 7,218,096 B2
(45) Date of Patent: May 15, 2007

(54) ADJUSTING DEVICE FOR CHIP ADAPTER TESTING PIN

(75) Inventors: Ching-Ping Huang, Taoyuan County (TW); Chi-Chuan Chu, Taoyuan County (TW)

(73) Assignee: Asustek Computer, Inc., Taipei (TW)

( * ) Notice: Subject to any disclaimer, the term of this patent is extended or adjusted under 35 U.S.C. 154(b) by 0 days.

(21) Appl. No.: 10/938,600

(22) Filed: Sep. 13, 2004

(65) Prior Publication Data

US 2005/0073330 A1  Apr. 7, 2005

(30) Foreign Application Priority Data

Oct. 6, 2003  (TW) ............... 92127717 A

(51) Int. Cl.
  *G01R 31/02* (2006.01)
  *B21F 1/02* (2006.01)
  *H01R 13/62* (2006.01)

(52) U.S. Cl. ............... 324/158.1; 140/147; 439/160

(58) Field of Classification Search ............ None
See application file for complete search history.

(56) References Cited

U.S. PATENT DOCUMENTS 2,513,821 A * 7/1950 Schneider ............... 254/131
2,531,085 A * 11/1950 Stacey ............... 439/564
2,973,219 A * 2/1961 Zalk ............... 294/92
3,106,945 A * 10/1963 Wright et al. ............... 140/147
3,156,511 A * 11/1964 Zillmer ............... 439/160
3,664,016 A * 5/1972 Sevc et al. ............... 29/407.1
4,083,619 A * 4/1978 McCormick et al. ....... 439/310
5,302,891 A * 4/1994 Wood et al. ............... 324/765
5,586,900 A * 12/1996 Yagi et al. ............... 439/310
5,697,801 A * 12/1997 Tsuji et al. ............... 439/310
6,224,404 B1 * 5/2001 Sauer ............... 439/160
6,439,912 B1 * 8/2002 Andric et al. ............... 439/342
6,490,167 B1 * 12/2002 Brownell et al. ........... 361/760

FOREIGN PATENT DOCUMENTS

GB   2118786 A  * 11/1983
TW   277773      6/1996

* cited by examiner

*Primary Examiner*—Ernest Karlsen
(74) *Attorney, Agent, or Firm*—Birch, Stewart, Kolasch & Birch, LLP

(57) ABSTRACT

An adjusting device for a chip adapter. The adjusting device comprises a main body having a plurality of adjusting holes into which testing pins of the adapter are inserted and a slider disposed on the main body and sliding perpendicular to the top surface thereof for easy removal the chip adapter without mis-alignment of testing pins.

6 Claims, 8 Drawing Sheets

ADJUSTING DEVICE FOR CHIP ADAPTER TESTING PIN

This Non-provisional application claims priority under 35 U.S.C. § 119(a) on Patent Application No. 092127717 filed in Taiwan, Republic of China on Oct. 6, 2003, the entire contents of which are hereby incorporated by reference.

BACKGROUND OF THE INVENTION

1. Field of the Invention

The present invention relates to an adjusting device, and in particular to a device for re-aligning the adapter testing pins.

2. Description of the Related Art

Mother boards must be tested during manufacture to verify function thereof. CPU chips are frequently inserted into and removed from a socket on a mother board. This can bend or break CPU testing pins.

To reduce damage, the CPU chip can be inserted into an adapter as disclosed in R.O.C. patent 277773, before insertion into a socket on the mother board. However, in this condition, the testing pins of the adapter can, similarly, be easily bent or broken.

In certain conditions, some bent testing pins of adapter may be forced into socket holes, potentially damaging the internal structure thereof.

To prolong the lifetime of the adapter, the adapter testing pins therefore must be adjusted after a period of use.

Adapter testing pins are normally adjusted manually a procedure which can not ensure the quality of alignment. Thus, a device is needed for more precise alignment.

SUMMARY OF THE INVENTION

Accordingly, an object of the invention is to provide a device to re-align adapter testing pins precisely, such that the adapter is easily separated therefrom after use.

The adjusting device of the invention comprises a main body having a plurality of holes receiving the testing pins, and an ejection slider disposed on the main body perpendicular to the top surface.

The testing pins of the adapter are inserted into the adjusting holes for realignment. As the adjustment is completed, the slider moves perpendicular to the top surface of the chip adapter to eject the chip adapter from the main body so that the testing pins of the adapter are not bent.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

Figure 1:
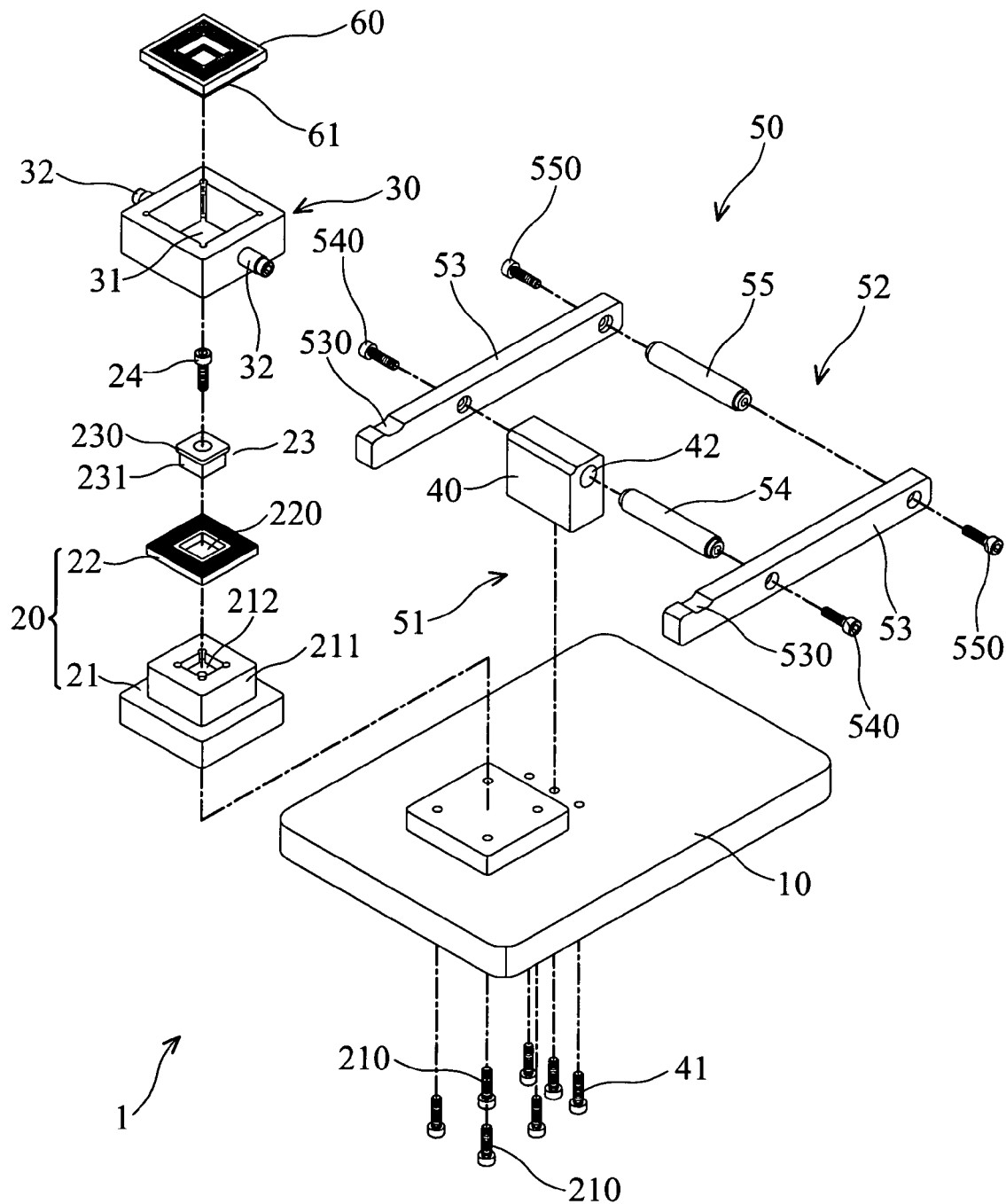
FIG. 1 is an exploded perspective view of the preferred embodiment of the invention.
Figure 2:
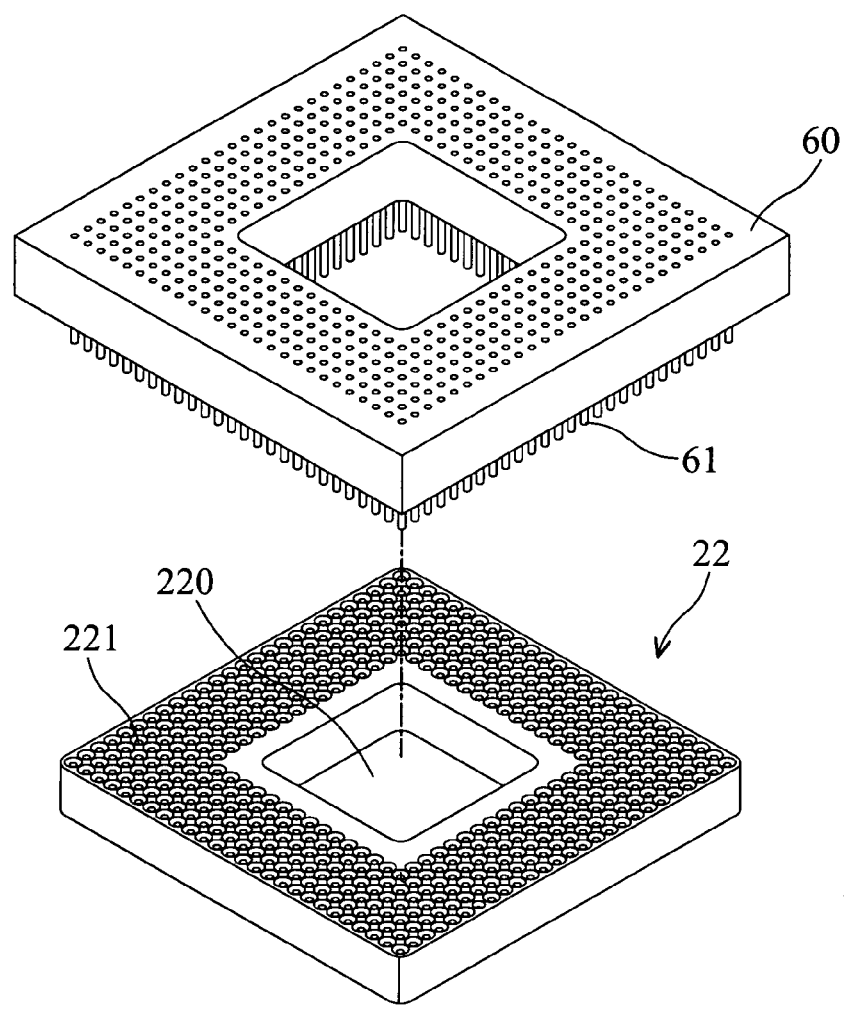
FIG. 2 is an enlarged view of the preferred embodiment showing the chip adapter and the adjusting plate.
Figure 3:
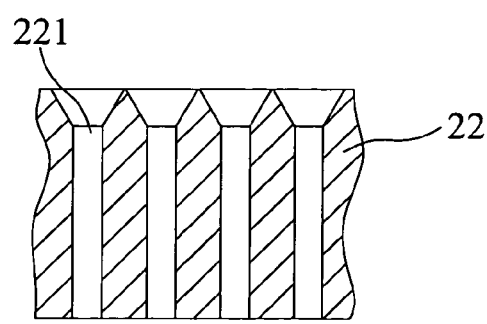
FIG. 3 is an enlarged schematic view of the adjusting plate of the invention.
Figure 4:
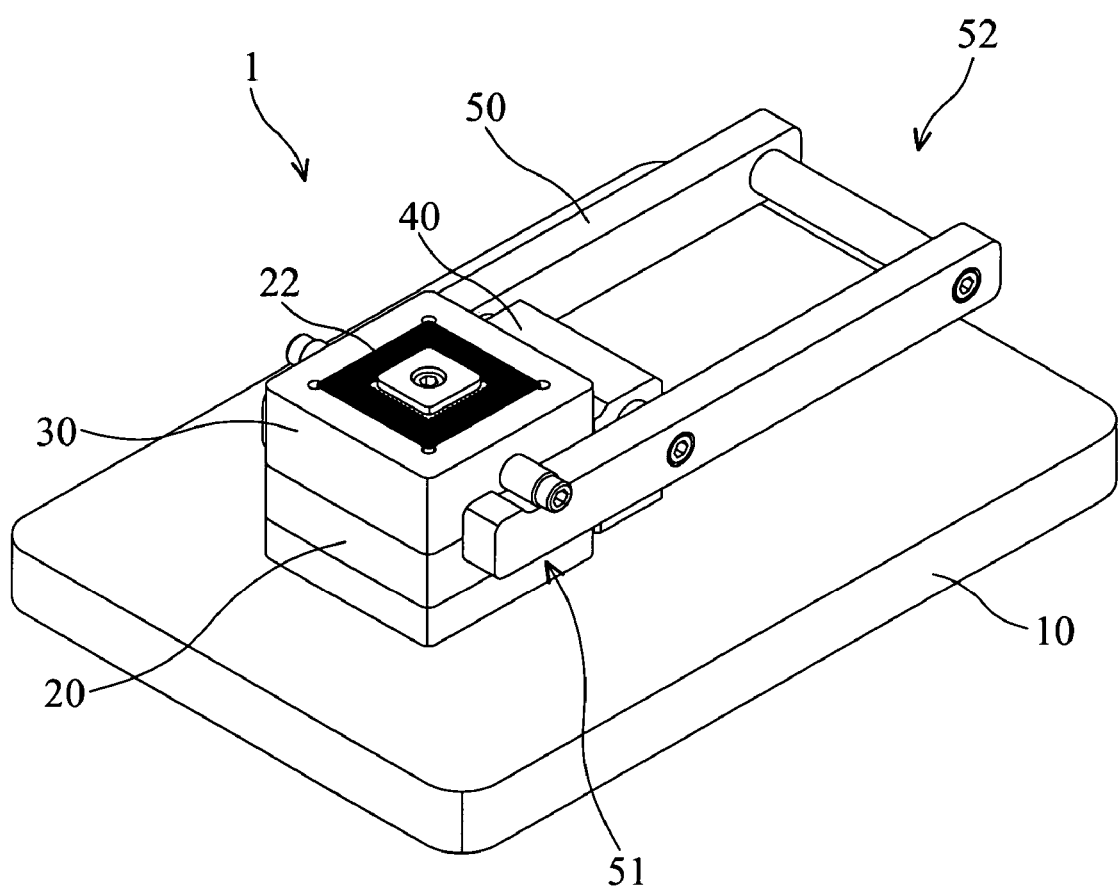
FIG. 4 is a perspective view of the preferred embodiment of the invention.
Figure 5:
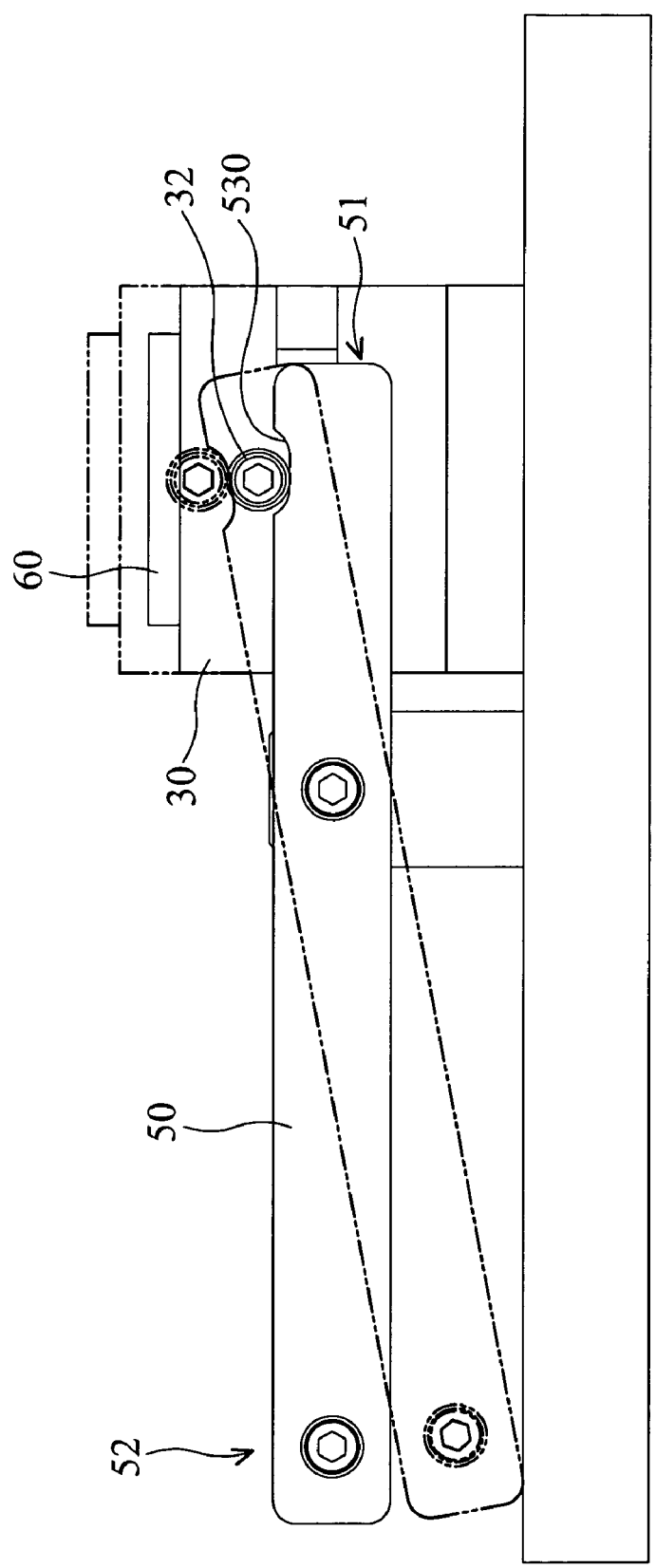
FIG. 5 is a side view of the preferred embodiment of the invention.

Referring to FIGS. 1–4, the adjusting device 1 comprises a base 10, a main body 20 including a seat 21 and an adjusting plate 22, a slider 30 having a building recess 31, a pivoting block 40 and a lever 50 having a second end 51 and a first end 52.

The seat 21 is fixed on the base 10 with bolts 210. A guiding block 211 provided with a cavity 212 is mounted on the seat 21. The adjusting plate 22 defines an opening 220 for receiving a block 23 having a flange 230 and a block body 231. The flange 230 abuts the edge of the opening 220 and the block body 231 extends through the opening 220. The block 23 is fixed on the seat 21 with a bolt 24. A plurality of adjusting holes 221 for receiving the testing pins 61 of the adapter 60 are arranged around the opening 220. The adjusting hole 221 is configured in a tapered shape with the diameter thereof slightly larger than the diameter of the testing pin 61.

A guilding recess 31 surrounds the guiding block 211 and can slide up and down thereon. Two studs 32 are disposed on opposite lateral surfaces of the slider 30.

The pivoting block 40 is fixed on the base 10 with bolts 41 and positioned near one side of the main body 20. The pivoting block 40 is provided with a shaft hole 42 for a shaft 54 to pass through.

The lever 50 includes two parallel side bars 53, a pivot 54 and a push rod 55. Side bars 53 each have a notch 530 near the second end 51 for contacting the stud 32. The pivot 54 passes through the shaft hole 42 with both ends thereof respectively connected to the two side bars 53, 53 by bolts 540. Both ends of the push rod 55 are connected to the two side bars 53 with bolts 550, and the push rod 55 serves as the first end 52.

Figure 6:
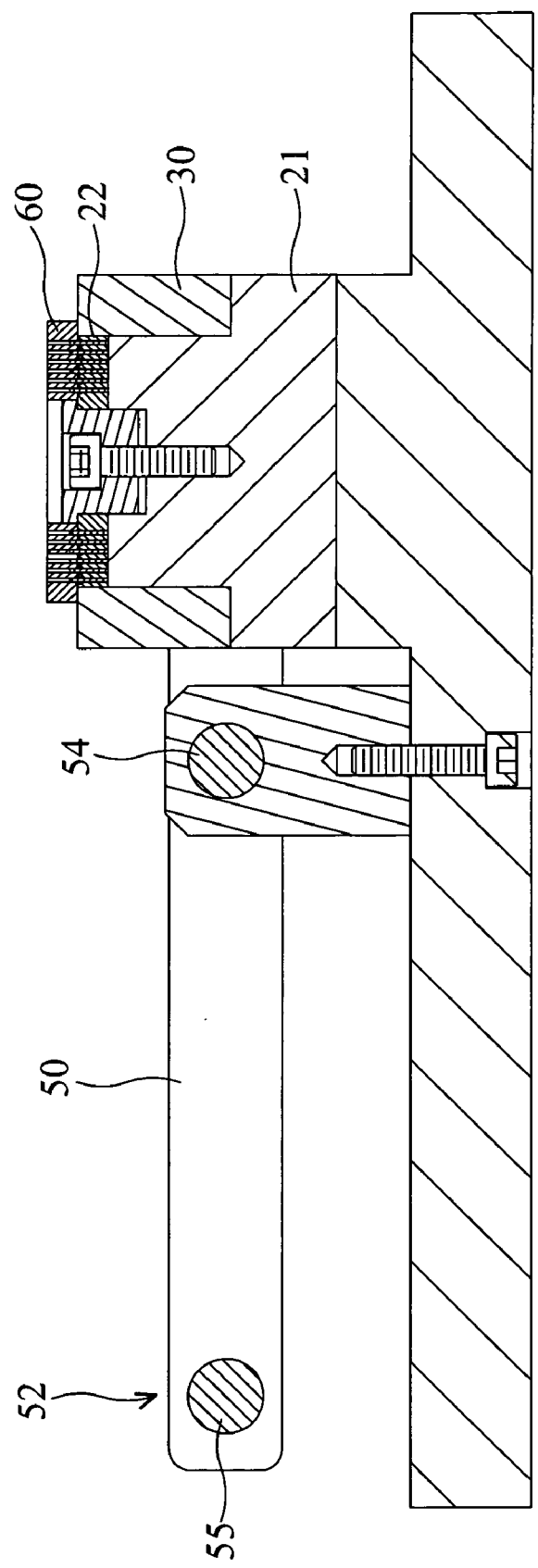
FIG. 6 is a cross-section of the preferred embodiment of the invention.
Figure 7:
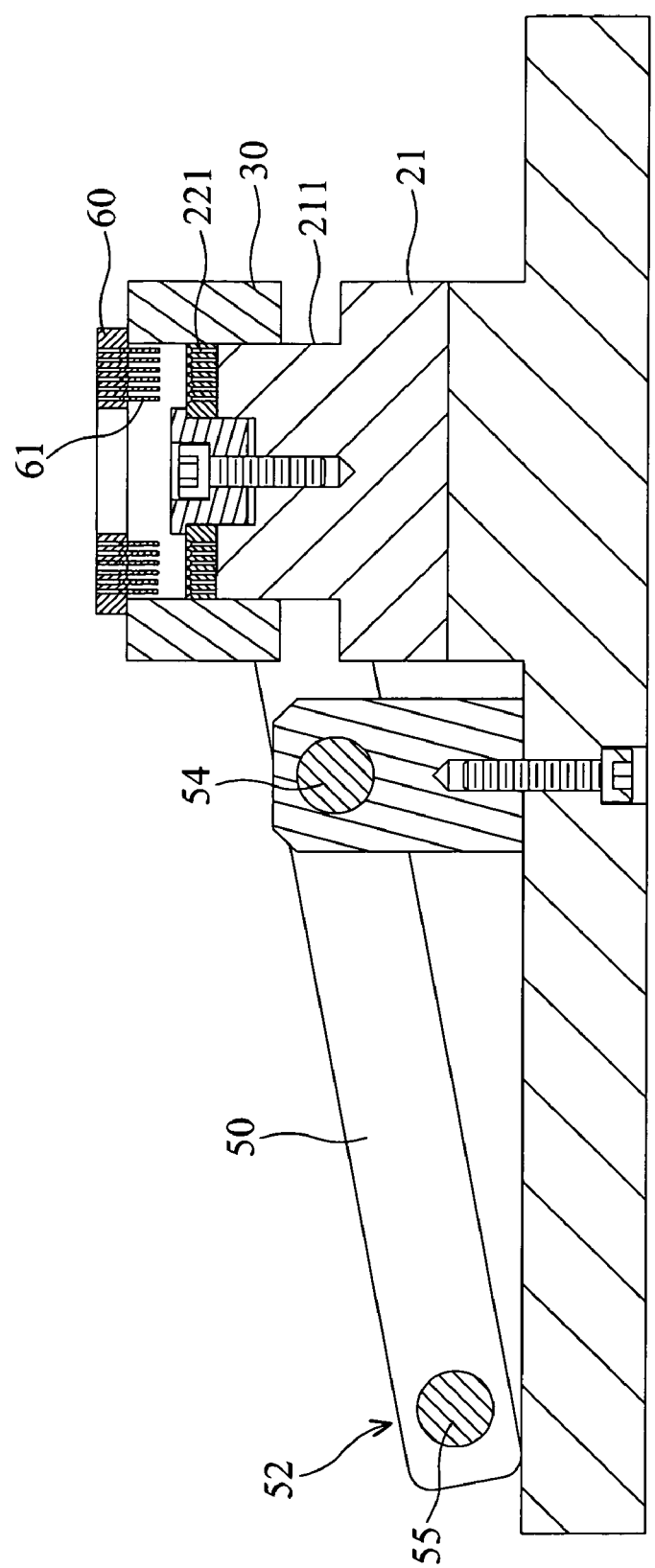
FIG. 7 is another cross-section of the preferred embodiment of the invention.
Figure 8:
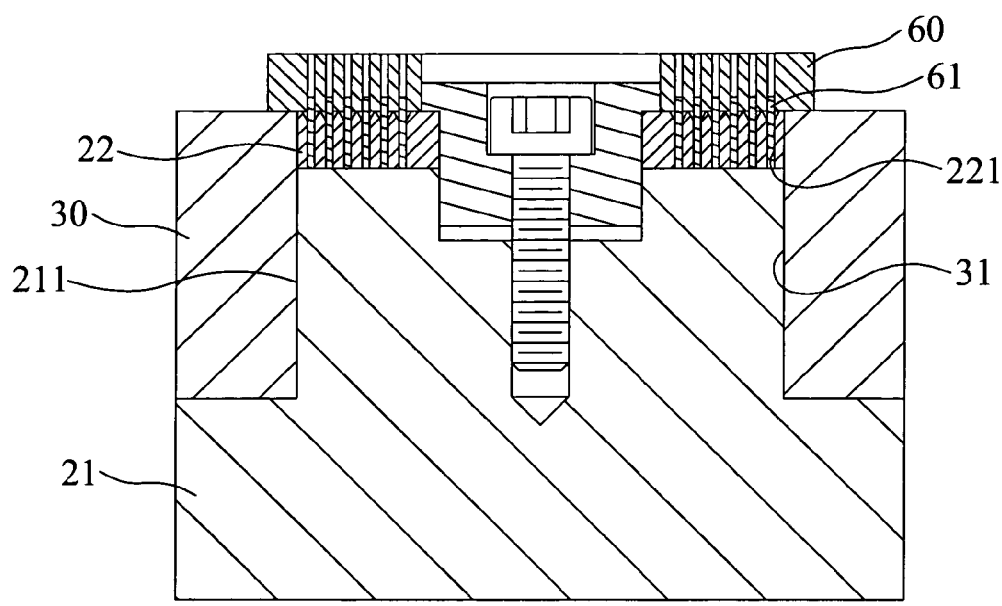
FIG. 8 is an enlarged view of the preferred embodiment of the invention showing the main body and the chip adapter.
Figure 9:
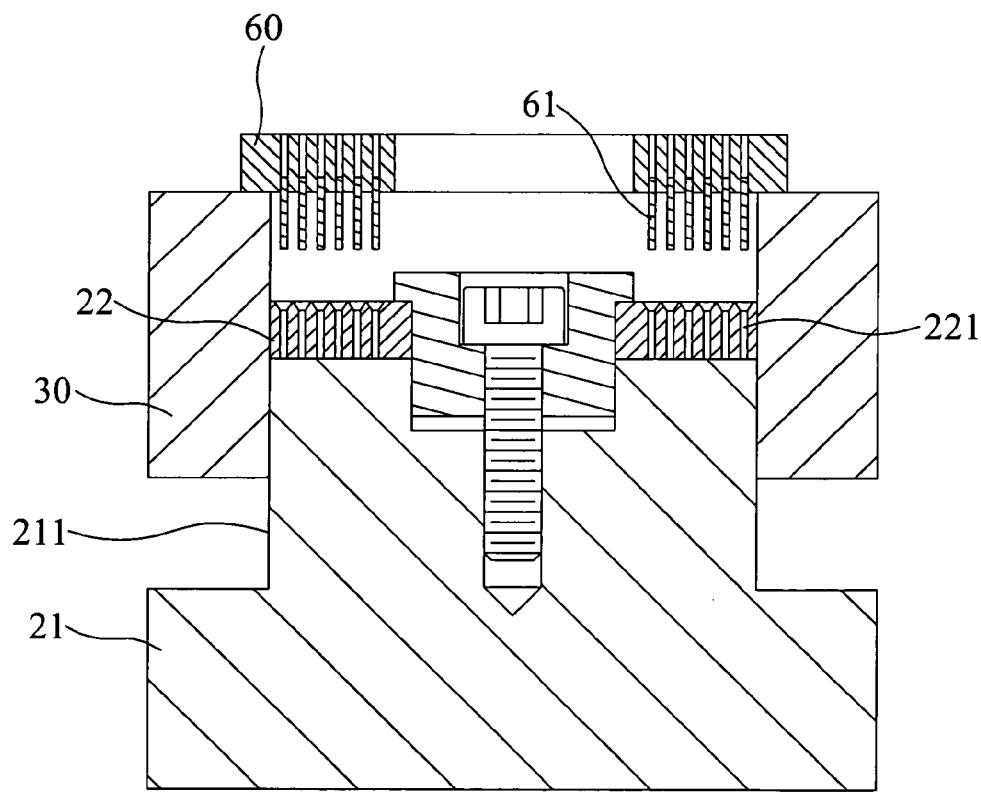
FIG. 9 is another enlarged view of the preferred embodiment of the invention showing the main body and the chip adapter.

Referring to FIGS. 6 and 8, when the adapter 60 is inserted into the adjusting plate 22, the alignment of the testing pins 61 can be adjusted following insertion into the adjustment holes 221.

Referring to FIGS. 5–9, when the first end 52 of the lever 50 receives downward force, the second end 51 rises at a certain angle with respect to the shaft 54 to lift the studs 32, such that the slider 30 moves along the guiding block 211 upward to lift the adapter 60, smoothly withdrawing testing pins 61 from the adjusting holes 221. Thus the adapter 60 is easily ejected from the main body 20.

Figure 10:
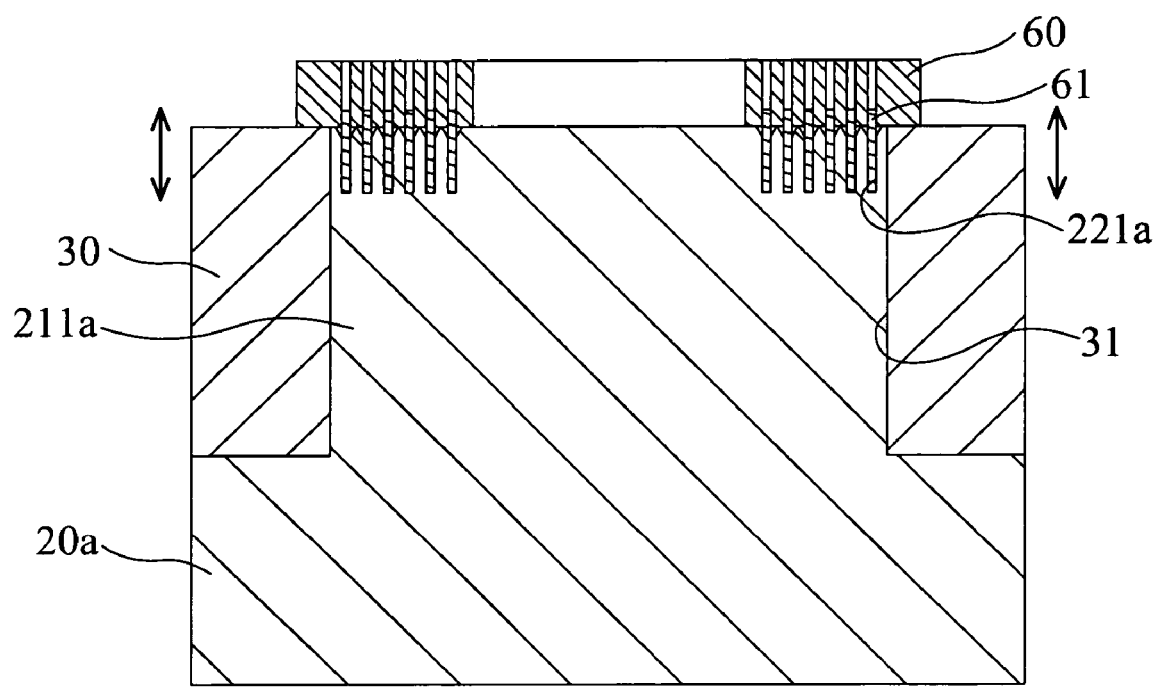
FIG. 10 is a cross-section of another embodiment of the invention.

FIG. 10 shows another embodiment of the invention. All components except the main body are the same as the previous embodiment. The main body 20a in this embodiment is provided with a plurality of adjusting holes 221a for receiving the testing pins 61 of the adapter 60. The adjusting hole 221a is configured in a tapered shape with the diameter thereof slightly larger than the diameter of the testing pin 61, and the largest diameter is provided at the entrance of the adjusting holes 221a. The main body 20a has a guiding block 211a along with the slider 30 moves.

The adjusting holes 221 of the adjusting plate 22 adjust the alignment of the testing pins 61 to avoid instability in the testing process resulting from bent testing pins 61. The lifetime of the adapter 60 is thus increased. The slider 30 is provided to eject the adapter 60 from the adjusting plate 22 without bending the testing pins 61.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An adjusting device for a chip adapter having a top surface and a plurality of testing pins, comprising:
   a main body having a seat with an adjusting plate fixed thereon, and being provided with a plurality of adjusting holes in the top surface thereof for receiving the testing pins and a first guiding portion; and
   a slider disposed on the main body and positioned under the adjusting plate and the chip adapter, which slides perpendicular to the top surface along the first guiding portion to lift the chip adapter perpendicular to the top surface.

2. The adjusting device as claimed in claim 1 wherein the adjusting hole has an entrance and is configured in a tapered shape having varied diameters, wherein the entrance is provided with the largest diameter.

3. The adjusting device as claimed in claim 1 wherein the slider has a guiding recess through which the guiding portion extends.

4. The adjusting device as claimed in claim 1 further comprising a base for the main body fixed thereon and a lever pivoting thereon, and being provided with a first end and a second end contacting the slider, wherein the first end receives downward force to move the slider.

5. The adjusting device as claimed in claim 1, wherein the slider has at least one stud on at least one lateral surface thereof to contact the second end.

6. The adjusting device as claimed in claim 1, further comprising a block having a block body and a flange, wherein the adjusting plate is provided with an adjustment opening accommodating the block in such a manner that the flange abuts the edge of the adjustment opening and the block body extends therethrough to fix the seat.

* * * * *